United States Patent
Vogel et al.

(10) Patent No.: US 6,502,221 B1
(45) Date of Patent: Dec. 31, 2002

(54) PROTOTYPE DEVELOPMENT SYSTEM

(75) Inventors: Ernest P. Vogel, Palo Alto; Sam J. Nicolino, Jr., Cupertino; Robert J. Hasslen, III, Redwood City; Fernando G. Martinez, Pleasanton, all of CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 09/351,783

(22) Filed: Jul. 12, 1999

Related U.S. Application Data

(60) Provisional application No. 60/092,692, filed on Jul. 14, 1998.

(51) Int. Cl.[7] .............................................. G06F 17/50
(52) U.S. Cl. ................................ 716/1; 716/8; 361/600
(58) Field of Search ........................ 29/507; 703/23.15; 716/16, 17, 1, 8, 4; 174/261; 705/28; 714/35; 361/600, 767, 769; 439/70, 912

(56) References Cited

U.S. PATENT DOCUMENTS

| | | | |
|---|---|---|---|
| 4,307,438 A | 12/1981 | Grubb | 361/413 |
| 4,990,095 A | 2/1991 | Walkup | 439/152 |
| 5,036,473 A | 7/1991 | Butts et al. | 703/23 |
| 5,077,451 A | 12/1991 | Mohsen | 174/261 |
| 5,109,353 A | 4/1992 | Sample et al. | 716/17 |
| 5,140,526 A | 8/1992 | McDermith et al. | 705/28 |
| 5,224,056 A | 6/1993 | Chene et al. | 716/7 |
| 5,259,006 A | 11/1993 | Price et al. | 375/356 |
| 5,414,638 A | 5/1995 | Verheyen et al. | 716/16 |
| 5,425,036 A | 6/1995 | Liu et al. | 714/735 |
| 5,452,227 A | 9/1995 | Kelsey et al. | 716/3 |
| 5,452,231 A | 9/1995 | Butts et al. | 716/16 |
| 5,475,830 A | 12/1995 | Chen et al. | 716/16 |
| 5,499,191 A | 3/1996 | Young | 716/17 |
| 5,612,891 A | 3/1997 | Butts et al. | 716/16 |
| 5,644,515 A | 7/1997 | Sample et al. | 703/23 |
| 5,646,521 A | 7/1997 | Rosenthal et al. | 324/158.1 |
| 5,657,241 A | 8/1997 | Butts et al. | 716/16 |
| 5,661,662 A | 8/1997 | Butts et al. | 716/16 |
| 5,699,283 A | 12/1997 | Okazaki et al. | 703/15 |
| 5,721,882 A | 2/1998 | Singh | 395/500 |
| 5,744,759 A * | 4/1998 | Ammen | 174/260 |
| 5,937,515 A | 8/1999 | Johnson | 29/847 |
| 6,002,861 A * | 12/1999 | Butts | 703/16 |
| 6,016,563 A * | 1/2000 | Fleisher | 714/25 |
| 6,036,503 A * | 3/2000 | Tsuchida | 439/70 |
| 6,190,181 B1 * | 2/2001 | Affolter | 439/70 |
| 6,249,440 B1 * | 6/2001 | Affolter | 361/769 |
| 6,270,356 B1 * | 8/2001 | Hoshino | 439/70 |

* cited by examiner

*Primary Examiner*—John F. Niebling
*Assistant Examiner*—Stacy Whitmore
(74) *Attorney, Agent, or Firm*—Silicon Valley IP Group; Kevin J. Zilka

(57) ABSTRACT

A prototype development apparatus includes a logic board (LB) including a plurality of integrated circuit (IC) sites each adapted to receive an IC, logic traces coupled to each of the IC sites, and a plurality of logic board connector sites (LBCSs) configured to provide access to a number of the logic traces and each adapted to receive a connector. Additionally, a mezzanine board (MB) has a plurality of mezzanine board connector sites (MBCSs) each adapted to receive a connector and configured to provide access to a number of mezzanine traces interconnecting the LBCSs. The MB board is coupled to the LB and a portion of the logic traces are coupled to a portion of the mezzanine traces. In another embodiment the MB does not have any active components. This is because in this embodiment, the MB is configured to connect the pins of the connector sites according to a predetermined program. A method of prototyping a target circuit generates a netlist representative of the target circuit, divides the netlist into portions to be programmed into ICs on the LB and portions to be fabricated on the MB, such that the target circuit is configured from both the LB and the MB. Advantages of the present invention include providing a cost-effective technique for developing a prototype that combines the advantages of the custom prototype speed with the flexibility of the re-programmable emulators.

18 Claims, 11 Drawing Sheets

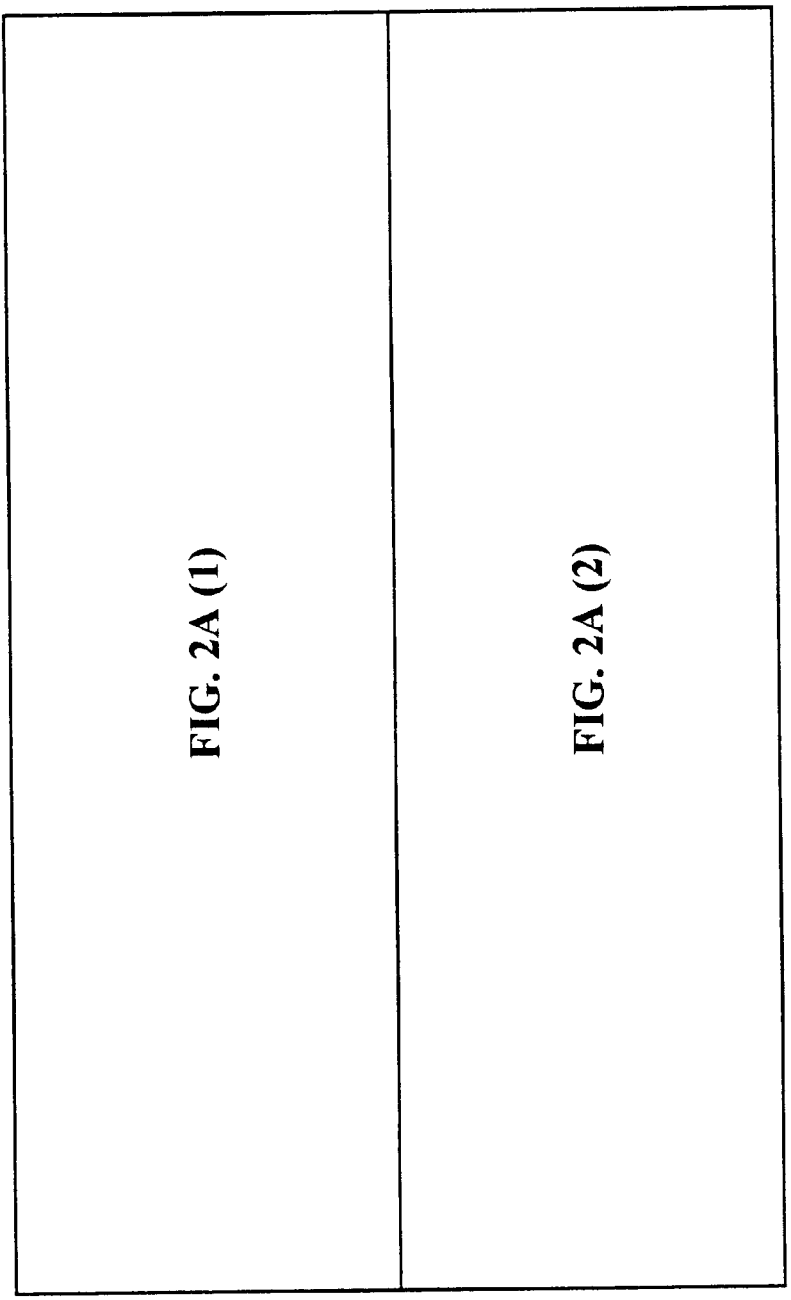

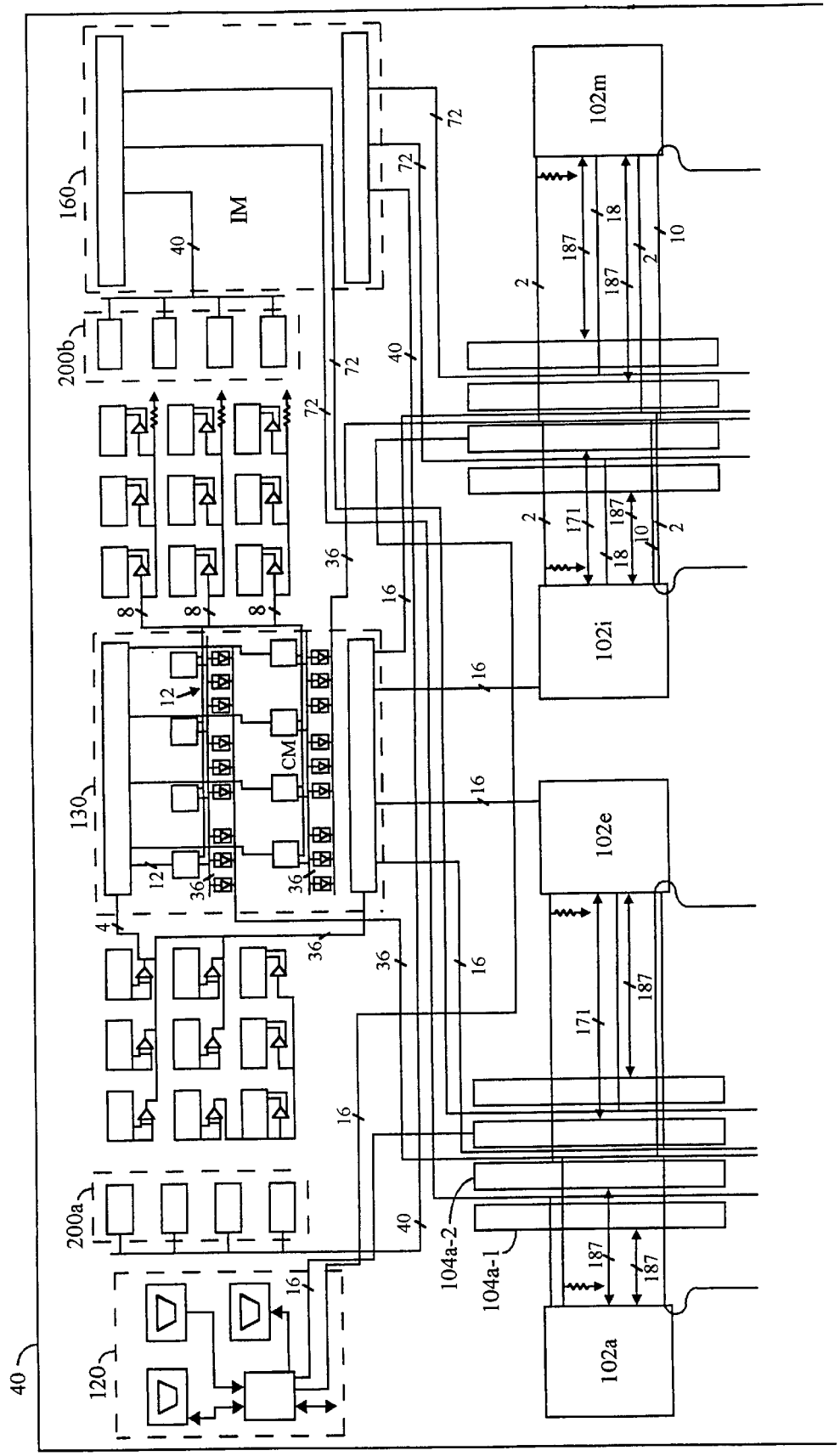
FIG. 2A (1)

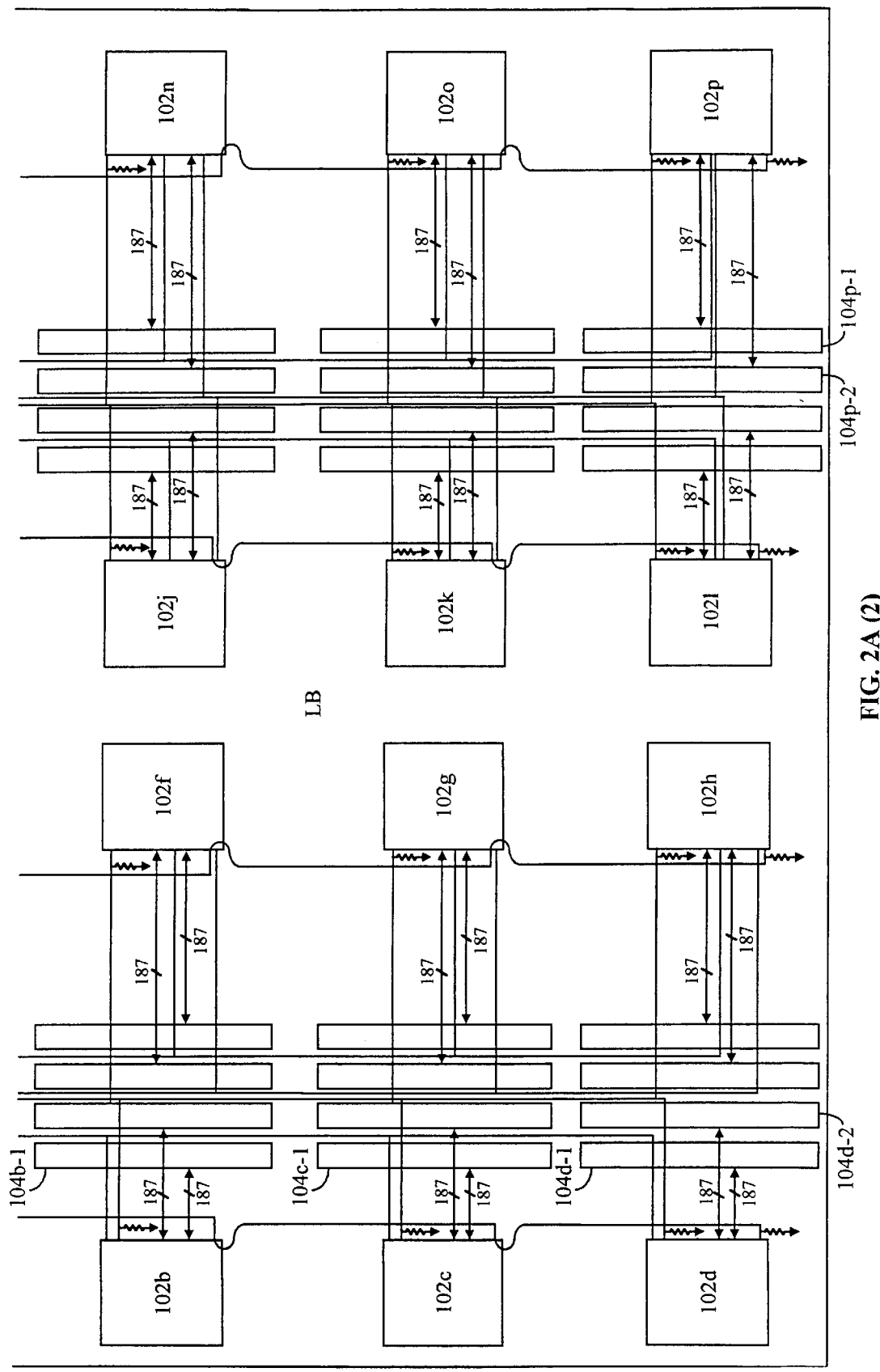
FIG. 2A (2)

PROTOTYPE DEVELOPMENT SYSTEM

This application claims the benefit of provisional application 60/092,692 filed Jul. 14, 1998.

FIELD

The present invention relates to a prototype development system. In particular, the invention is used by engineers to quickly and accurately develop a electronic prototype that is designed to represent a target circuit such as a microprocessor.

BACKGROUND

Prototype construction has been used by many electronics companies to improve their circuit designs before investing large sums of money in fabricating integrated circuits. One conventional technique of verifying a circuit is a software simulation. In this technique, the circuit is portrayed by software in a computer and the computer performs all the steps necessary to simulate operation of the circuit. This technique is time consuming both in that the computer must be programmed for each of the circuit elements (sometimes taken from a library) and that the general purpose computer must simulate all the signals internal to the simulated circuit. A high performance computer can simulate the clock rate of the circuit at only a small fraction of the actual circuit operational clock, for example, $1/1,000,000$ of real time.

Alternatively, conventional emulation techniques can be used that more accurately portray the operational circuit. A conventional emulation technique is described in U.S. Pat. No. 5,036,473. This type of emulator employs programmable gate arrays (PGAs) that are programmed to perform the functions of the desired circuit. The PGAs are coupled to one another by a cross-bar switch network that is controlled with a switch controller. In order to emulate the desired circuit, both the PGAs need to be programmed as well as the switch network. The switch network programming is generally difficult because it requires that the connections between the PGAs be programmed for specific connections at specific times, while adhering to a myriad of constraints. This task can easily take an engineer a week or more to write. A high performance emulator can emulate the clock rate of the circuit by only a small fraction of the actual circuit operational clock primarily due to the programmable interconnect.

Both the software technique and the emulator technique suffer from the time required to either simulate or emulate the design. For example, a Pentium class processor has in excess of 8 million transistors (about 2 million gates), and the clock rate of a Pentium class processor can be in excess of 500 Mhz. A high performance computer can only clock the simulated design at a rate of approximately 500 Hz. As a result, full simulation of the design could take months or years. A high performance emulator may be able to clock the emulated design at a rate of approximately 500 KHz. As a result, full simulation of the design could take weeks or months. Moreover, if a problem is discovered in the design or in the simulation or emulation, additional weeks or months are spent fixing and re-simulating or re-emulating the design. This is a very expensive and time-consuming process.

An alternative to simulation and emulation is a custom prototype. This is an expensive and time-consuming task since it means starting from scratch for each design. The engineer constructs a custom prototype using programmable logic and a dedicated target board. The custom prototype provides the most realistic circuit and can simulate the desired circuit the fastest since the custom prototype employs dedicated processors and interface components. However, if a modification is desired (e.g., due to an error or design change), modifying the custom prototype can be expensive and time-consuming, if not impossible.

Accordingly, a limitation of conventional simulation and emulation techniques are that they are expensive and slow. Additionally, conventional emulators are difficult to program, and any modifications made to the design cause substantial circuit modification and re-programming. Moreover, a limitation to the custom prototype is that modification is expensive, if not impossible.

Therefore, a goal of the invention is to overcome the identified limitations and to provide a cost-effective technique for developing a prototype that combines the advantages of the custom prototype speed with the flexibility of the re-programmable emulators.

SUMMARY

The invention overcomes the identified problems and provides a prototype system that combines the advantages of the custom prototype speed with the flexibility of the re-programmable emulators. An exemplary embodiment of a prototype development apparatus includes a logic board (LB) including a plurality of integrated circuit (IC) sites each adapted to receive an IC, logic traces coupled to each of the IC sites, and a plurality of logic board connector sites (LBCSs) configured to provide access to a number of the logic traces and each adapted to receive a connector. Additionally, a mezzanine board (MB) has a plurality of mezzanine board connector sites (MBCSs) each adapted to receive a connector and configured to provide access to a number of mezzanine traces interconnecting the MBCSs. The MB board is coupled to the LB and a portion of the logic traces are coupled to a portion of the mezzanine traces.

In the exemplary embodiment, the MB does not have any active components.

This is because in this embodiment, the MB is solely configured to connect the pins of the connector sites. However, additional embodiments employ components on a portion of the MB.

In another embodiment, the integrated circuits (ICs) are programmable gate arrays (PGAs) that can be re-programmed. A computer is used to generate a netlist representative of a target circuit. The computer divides the netlist into first portions to be programmed into the PGAs and second portions to interconnect the PGAs. The computer then programs the first portions into the PGAs. A mezzanine board is fabricated based on the second portions. Finally, the LB and the MB are coupled together such that the target circuit is constructed from both the LB and the MB.

In practice, the LB contains re-programmable PGAs and the MB contains a dedicated interconnect structure (the mezzanine traces). With these two boards coupled to one another, flexibility is achieved because the PGAs are re-programmable and speed is achieved because the interconnect structure is dedicated traces. Moreover, the interconnect structure can be quickly modified by re-fabrication and replacement of the MB.

Advantages of the present invention include providing a cost-effective technique for developing a prototype that combines the advantages of the custom prototype speed with the flexibility of the re-programmable emulators.

BRIEF DESCRIPTION OF THE FIGURES

Additional advantages of the invention will become apparent upon reading the following detailed description and upon reference to the drawings, in which:

FIGS. 2A–B depict a logic board according to an embodiment of the invention;

DETAILED DESCRIPTION

Exemplary embodiments are described with reference to specific configurations. Those skilled in the art will appreciate that various changes and modifications can be made while remaining within the scope of the claims.

Figure 1:
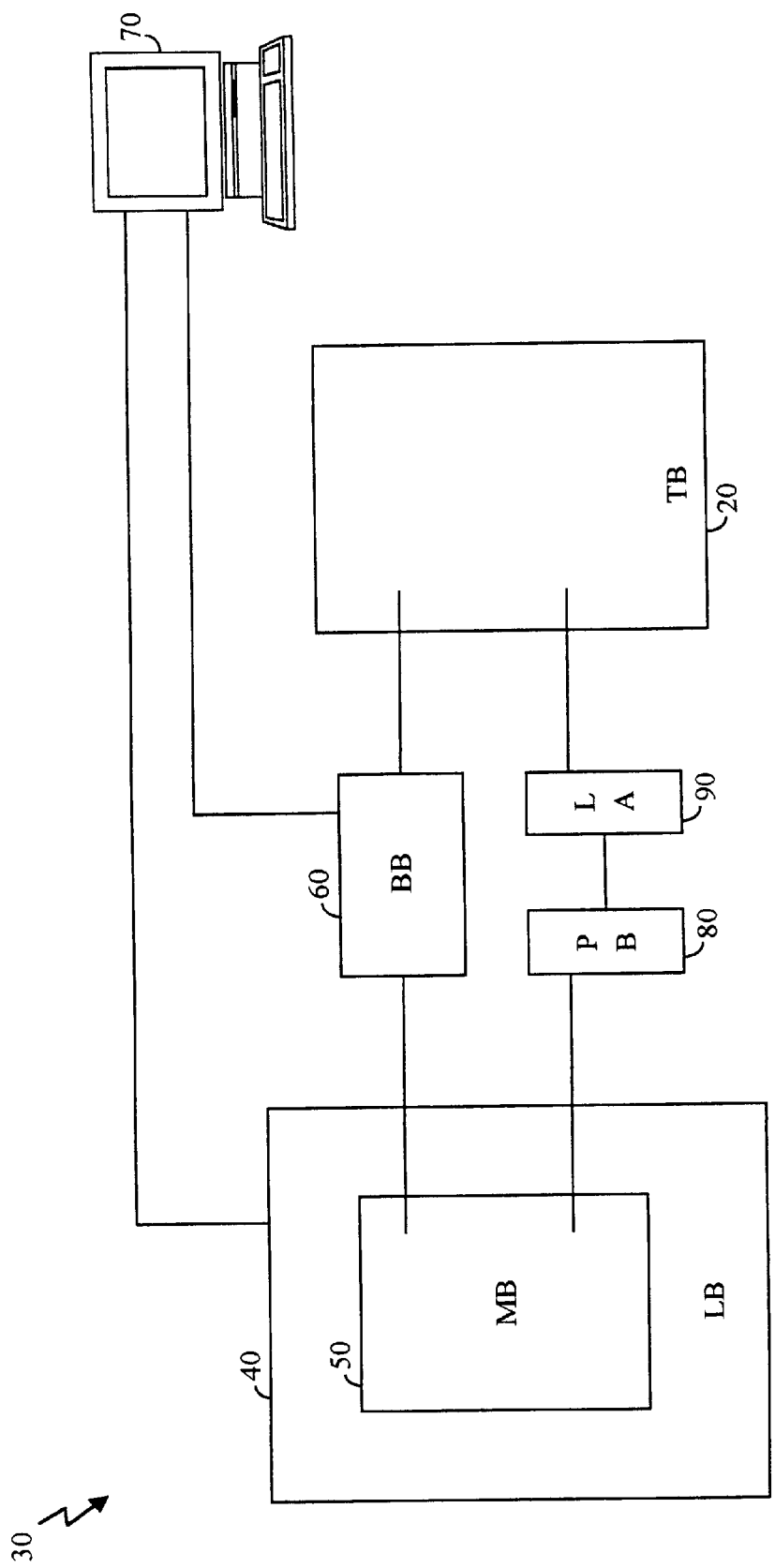
FIG. 1 depicts a prototype system according to an embodiment of the invention coupled to a computer and a target board (TB). An optional Logic Analyzer (LA) is shown for monitoring signals on both the PB and TB while debugging the prototyping system.

FIG. 1 depicts a prototype system according to an embodiment of the invention coupled to a computer and a (TB). An engineer designs a (TB) 20 that will include a prototype 30, sometimes referred to as a target circuit. The target circuit 30 is the electrical circuit that the engineer desires to construct as a prototype. As such, the target circuit is a part of the prototype development system. The prototype development system includes a (LB) 40 and a (MB) 50. The (LB) 40 includes integrated circuits that prototype the functions to be performed in the target circuit. The (MB) 50 is coupled to the (LB) 40 and provides the interconnections between the integrated circuits. The prototype development system also includes a (BB) 60 disposed between the (TB) 20 and the (MB) 50. The (BB) 60 serves to interface the (TB) 20 with the target circuit 30, as described below.

A computer 70 is coupled to the logic board 40 and the buffer board in order to transmit signals to the target circuit 30 and to receive signals from the target circuit 30. The computer is typically used for downloading the design information into the programmable ICs and for coordinating instrumentation. The computer can act as a logic analyzer by receiving and storing data from the target circuit or buffer board. Additionally, the computer can be coupled to the target board for providing data to the target board or for receiving data from the target board. The computer can also provide data to the target circuit from its memory or from another source of data somewhere on an interconnected network. The source could be a simulator running in parallel with the prototype system as well.

A (PB) 80 is coupled to the mezzanine board 50 to interface with a (LA) 90. The logic analyzer is also coupled to the target board 20 and can sample signals on the target board 20 and mezzanine board 50. The logic analyzer supplies signal state information for debugging the target board 20 and target circuit 30.

Figure 2B:
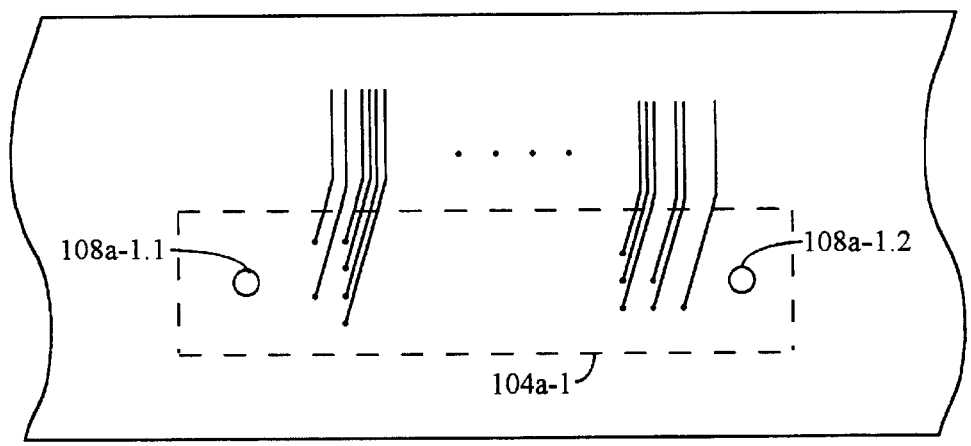

FIGS. 2A–B are a more detailed view of the logic board 40. The logic board is a six signal layer printed circuit board, and there are a number of integrated circuit (IC) sites 102a–102p distributed thereon. Each of these sites is adapted to receive an IC and includes either a socket for the IC or bonding pads for the IC. In the exemplary embodiment, there are 16 socket for field programmable gate arrays (FPGAs) such as Altera 10k100 series FPGAs having a 503 pin ceramic package with 374 user input/output pins. These ICs are good for prototype purposes because they can be re-programmed. For example, if an error in the target circuit 30 is discovered during testing, the error can be fixed and the PGAs can be re-programmed to eliminate the error. The logic board includes a configuration I/O port 120. This port 120 is coupled to the computer 70 and to each of the PGAs. Port 120 serves as the port through which the PGAs are programmed, the PGAs are tested, the clock delay circuit is programmed, the buffer board is programmed and cascade logic is programmed. The logic board 40 has logic traces that supply power, clocking and signaling. The signal traces are routed from the IC sites 102a–102p to Logic Board Connector Sites (LBCS) 104a-1 to 104p-2, where each PGA is connected to two connector sites (e.g. 104a-1 and 104a-2). The LBCS are designed to provide access to signal traces coupled to the IC sites, and particularly to traces coupled to the user input/output pins. In some cases, each IC has a connector group dedicated to it. In other cases, where the number of logic traces to the connectors exceed the number of available connections, more than one connector group can be used for each IC or ICs can share connectors.

The exemplary embodiment is constructed such that all the signal traces are connected to the LBCSs. However, in another embodiment, a portion of the signal traces are directly connected to other ICs. In even another embodiment, a portion of the signal traces directly connected to other ICs are not connected to the LBCSs. In any case, it is preferable to have more than 50% of the signal traces coupled to the LBCSs, more preferable to have 70% of the signal traces coupled to the LBCSs and most preferable to have 90% of the signal traces coupled to the LBCSs.

Figure 3A:
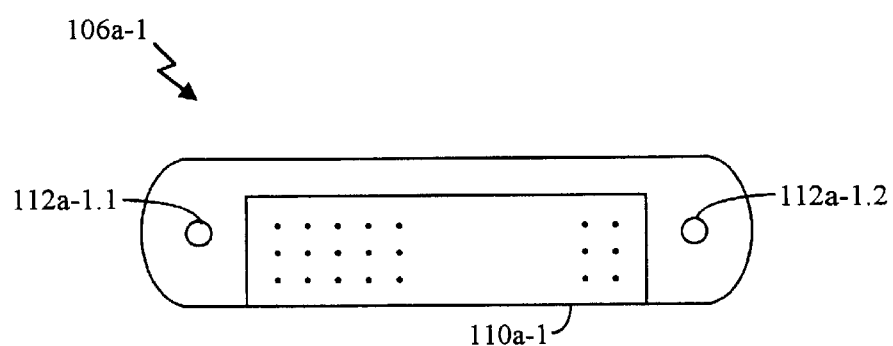
FIGS. 3A–B depict a connector structure according to an embodiment of the invention.
Figure 3B:
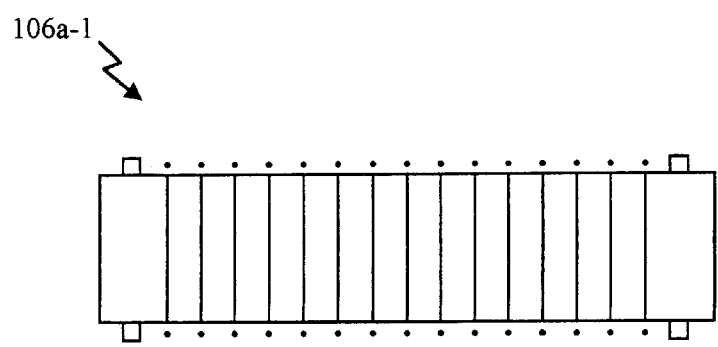

FIG. 2B shows that each of the LBCSs 104a-1 to 104p-2 are designed to have a high density interconnect with respective connectors 106a-1 to 106p-2. In order to achieve the desired high interconnect, a technique of using gold dots is employed. This technique involves constructing a high density of pads in the LBCSs that are constructed from corresponding logic traces. In the exemplary embodiment, each connector site has 200 pads. An example of the density that can be achieved with this technique is 100 pads/inch$^2$. The LBCSs are constructed in a substantially rectangular pattern and include a pair of holes 108a-1.1 and 108a-1.2 in the LB adjacent to opposite sides of the rectangle. These holes are for bolting a connector, for example, connector 106a-1 onto the LB as shown in FIGS. 2B and 3A–B. The connector 106a-1 is constructed from a firm structure of steel or plastic that supports a group of raised gold dots formed on a flexible printed circuit board 110a-1 corresponding to the pads on the LBCSs. The connector presses the raised gold dots to the pads to form the connections. Bolts are provided through the holes 108a-1.1 and 108a-1.2 into threaded receptors 112a-1.1 and 112a-1.2 respectively to hold the connector 106a-1 in place at the LBCS 104a-1. Referring to FIG. 3B, the flexible printed circuit board 110a-1 includes traces that connect the raised gold dots on one side of the connector to raised gold dots on the other side of the connector. The connector further includes threaded receptors on the other side of the connector for bolting the connector onto the MB. In one embodiment, the connector includes an elastomer material behind the flexible printed circuit board 110a-1 in order to provide some cushion between the firm structure of the connector and the flexible printed circuit board 110a-1 and apply pressure between the flexible printed circuit board 110a-1 and the respective connector site. Alternately, the gold dots can be formed on the LB and the MB and the connector is constructed to have the pads. Other examples of connectors that can be used in the invention are connectors such as those available from Form Factor, Inc. (www.formfactor.com) and E-tec Interconnect Ltd. (www.e-tec.ch).

Figure 5:
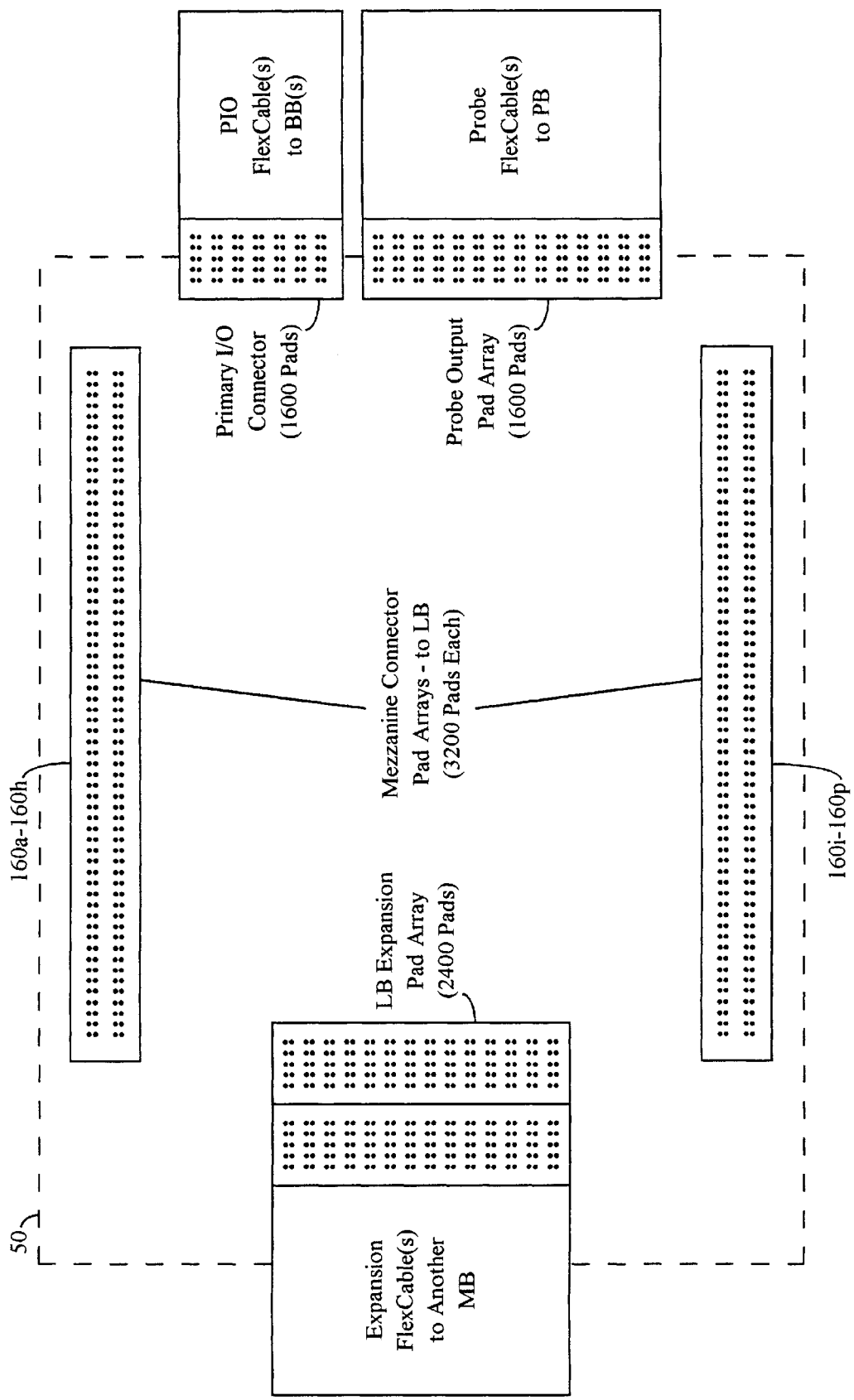
FIG. 5 depicts a mezzanine board according to an embodiment of the invention.

FIG. 5 depicts the mezzanine board 50. The MB includes a numbers of mezzanine board connector sites (MBCSs) 160a-1 to 160p-2 that correspond to LBCSs 104a-1 to 104p-2. The MBCSs have the same physical structure as the LBCSs shown in FIG. 3A. In this manner, the MB has holes that correspond to the connector receptors and the connector is bolted to the MB to connect the MBCS to the connector flexible printed circuit board 110a-1. Though the connectors 106a-1 to 106p-2, the pads on the LB are coupled to the pads on the MB. The MB includes a number of mezzanine traces that interconnect the pads at each of the MBCSs. In the exemplary embodiment, the MB is a 20 layer printed circuit board that serves exclusively as a connection structure and does not include any active components. In alternate embodiments, the MB does include active components such as a state hold circuit. Such a circuit holds a value on a trace, which is often helpful to sustain the signal beyond that which the circuit generating the signal would hold it. Therefore, in some embodiments this feature is helpful to prototyping the target circuit.

The exemplary embodiment of the MB is constructed without any active elements. As described, some alternative embodiments may use some active elements, however, in these alternate embodiments some mezzanine traces will still connect the MBCSs with minimal or no interference. This being the case, it is preferable to have more than 50% of the mezzanine traces coupled from one MBCS to another MBCS, more preferable to have 70% of the mezzanine traces coupled from one MBCS to another MBCS and most preferable to have 90% of the mezzanine traces coupled from one MBCS to another MBCS.

The invention is designed to prototype a target circuit. As such, the target circuit is divided into the two main portions described. The portion of functionality and low-level connectivity is constructed into the ICs. The portion of higher-level interconnection (between the ICs) is constructed on the MB. The MB serves to connect the logic traces from the ICs that are coupled to connectors 106a-1 to 106p-2.

If the engineer wants to change the target circuit, for example if an error is discovered, two types of changes are possible. A first is one that involves the PGAs, and a second is one that involves the interconnection between the PGAs. The first type is handled through the configuration I/O port 120 of FIG. 2A. The second type is handled by re-fabricating the MB. In one embodiment, the MB is a fully custom structure that is fabricated for each prototype. If an error is discovered in the prototype, a new MB is routed by a computer and fabricated. One interesting feature of the invention is that conventional automatic routers can re-route the traces on the mezzanine board in a matter of hours, and then the MB can be re-fabricated in a matter of days. However, in the conventional cross-bar switch technology of the type described in U.S. Pat. No. 5,036,473, the switch controller may take a week to re-program. Therefore, an advantage of the invention is that often the MB can be re-fabricated and re-coupled to the LB faster than the conventional emulator can be re-programmed.

To improve MB fabrication even more, the MB can be partially routed with a predetermined route, and then additional layers can be fabricated to add routing between the MBCSs. This further reduces the time required to re-fabricate the MB. As a result, design changes can be quickly implemented with a field replaceable MB.

In addition to the MBCSs, the MB has connectors for coupling the prototype system to the buffer board 60, the computer 70, a probe board 80 and other external structures. One of the external structures can be additional target circuits, as explained below.

Figure 4:
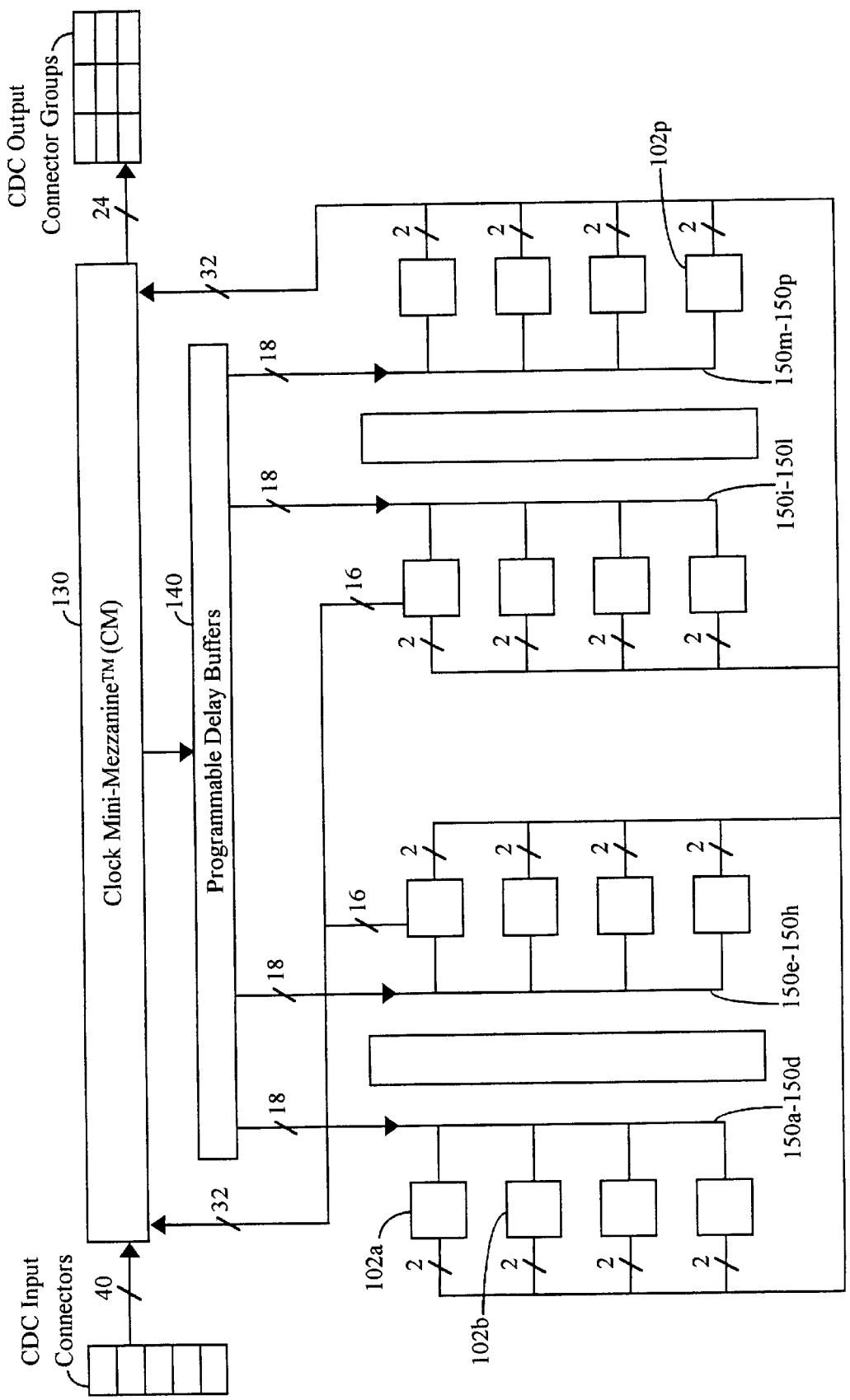
FIGS. 4 depicts a global clock routing on the logic board according to an embodiment of the invention.

The LB has three groups of traces: power traces, clock traces and signal traces. The discussion so far has focused on the signal traces, however, the clock traces are also important. FIG. 2A shows greater detail how the clock signals are generated by a clock source, such as an on-board source (e.g. a crystal) or an off-board source. The clock source is supplied to one of the ICs and then provided to a clock mezzanine board (CMB) 130. The LB includes logic board clock connector sites (LBCSs) that are configured to provide access to a number of clock traces on the LB and adapted to receive a clock connector (same as FIGS. 3A–B connector). The CMB 130 includes clock mezzanine board connector sites (CMBCSS) that are adapted to receive the clock connector and to provide access to a number of clock mezzanine traces. The CMBCS are similar in construction to the LBCS and can employ the same type of connector to connect the CMB to the LB. The CMB receives the clock signal through the clock connector and the clock mezzanine traces distribute the input clock signal to a number of other traces in the CMBCSs. The LB includes traces that convey the clock signal from the CMB to a programmable clock delay circuit 140. The delay circuit selectively delays the clock signals to selected ICs and distributes the clock signals over clock traces 150a–150p as shown in FIG. 4. In the exemplary embodiment, the LB has 18 global clock traces. This technique is beneficial for several reasons including that the CMB 130 provides flexibility to route the clock signals from the CMB to any of the inputs of the delay circuit 140. The CMB is similar to the MB in that the CMB serves as an interconnect structure to connect traces from the clock input to the clock delay circuit 110, and ultimately for distribution to the ICs 102a–102p. The CMB is ordinarily free of active components, however, some active components could be constructed on the CMB, and Applicant here repeats the same description of the preference for a high percentage of traces between a input pad and an output pad with minimal or no interference.

The logic board also includes traces for communicating with an incremental mezzanine board (IMB) 160, as shown in FIG. 2A and FIG. 5. The IMB is essentially an expansion board that can be used by the LB as needed. The LB includes incremental mezzanine board connector sites (IMBCSs) that are configured to provide access to a number of logic traces on the LB and adapted to receive an IMB connector. Likewise, the IMB 160 includes IMB connector sites (IMBCSs) that are adapted to receive the IMB connector and to provide access to a number of incremental mezzanine traces. The IMB's function is to provide for small incremental interconnect changes during system debug, without having to change the MB. This capability is over and above the incremental interconnect supported by routing spare traces on the MB in the first place, as described earlier. The IMB also connects to ten, 8 pin, general purpose connectors (200a and 200b in FIG. 2A) for expanding its scope beyond one LB/MB pair.

Figure 6:
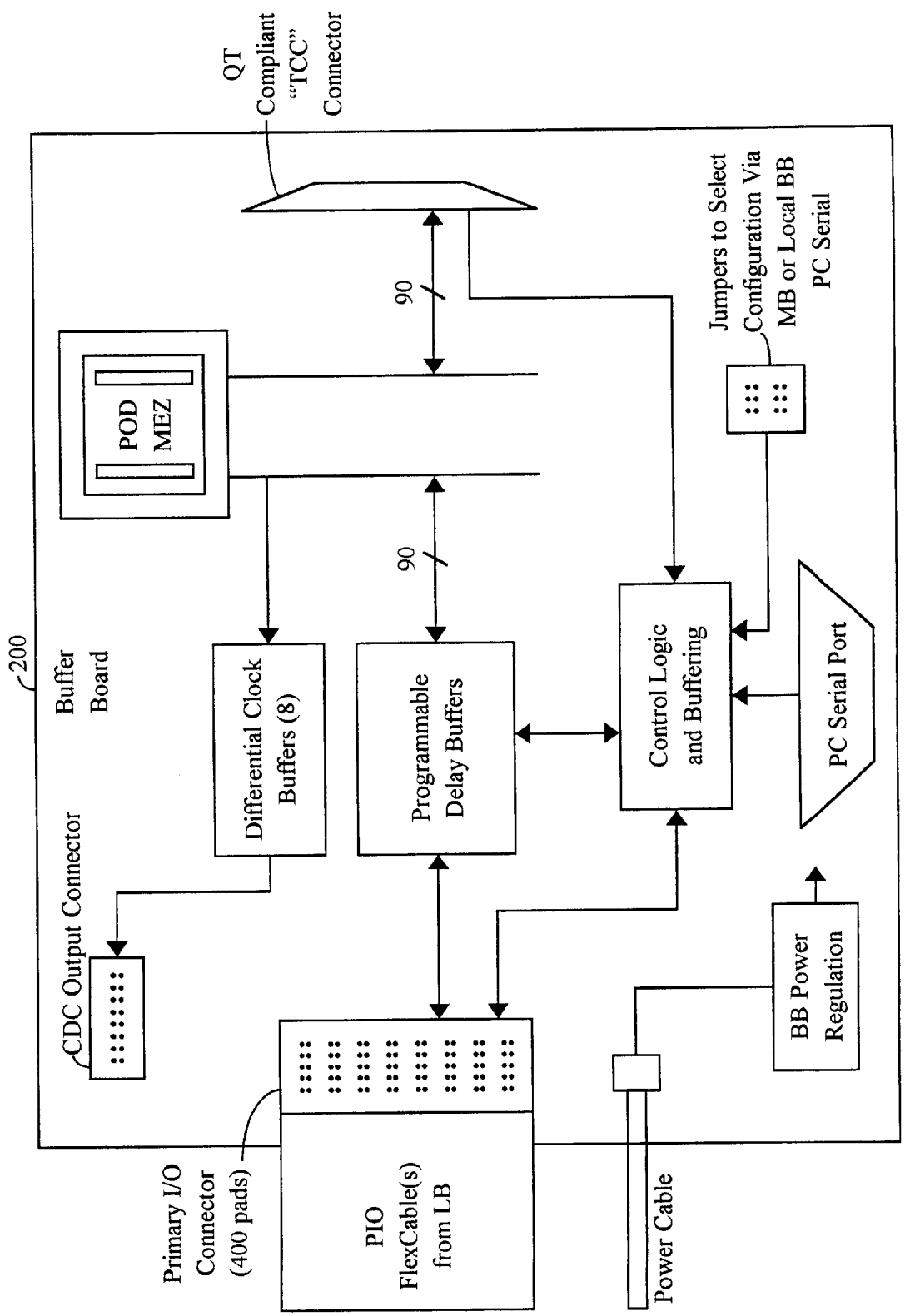
FIG. 6 depicts a buffer board (BB) according to an embodiment of the invention;.

Referring back to the MB, in addition to the MBCSs, the MB has connectors for coupling the prototype system to the buffer board 60, the computer 70, a probe board 80 and other external structures. FIG. 6 depicts a buffer board (BB) 200 that interfaces with the target board 20. The BB connects to the target board where the target circuit in intended to connect. The BB can support up to 90 primary I/O, and additional BBs can be used if more I/O are required. The BB's function is to provide for top-level target circuit 30 AC timing compliance by the use of programmable tapped analog delay lines previously referred to as PDBs. (See FIG. 6) This is very important when building prototype "replicates." Without this capability the same PGA programming files could not be used for the various replicates. The top level I/O PDBs in the BB allow each replicate to the "tuned up" so that they look electrically identical from a functional and a timing (AC characteristics) point of view.

The BB also provides load isolation for the target board circuitry 20. In addition the BB allows target circuit 30 to have I/O pins operating at different voltages (e.g. 5.0 Volts, 3.3 Volts, 2.5 Volts).

Figure 7:
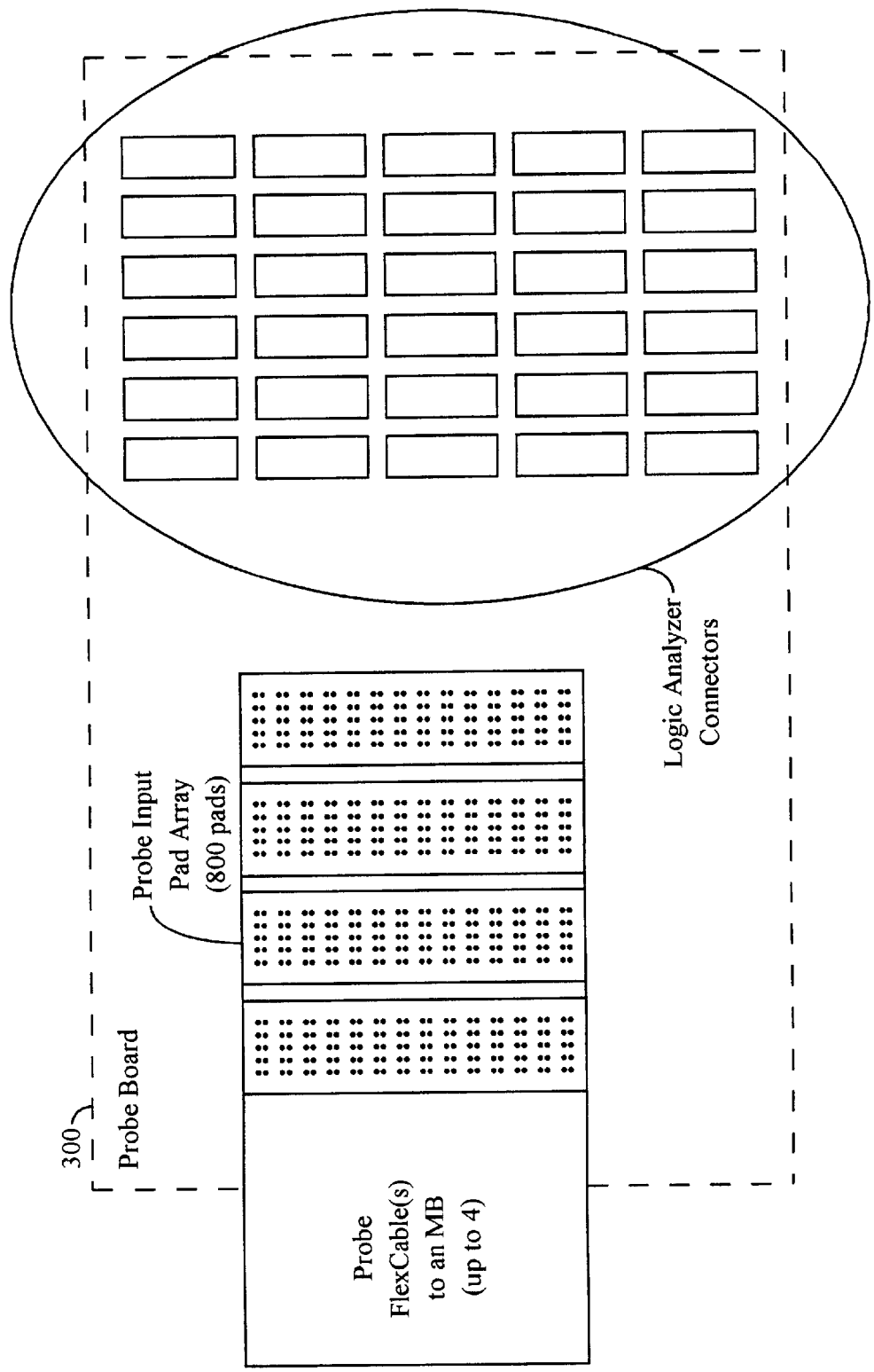
FIG. 7 depicts a probe board (PB) according to an embodiment of the invention.

FIG. 7 depicts a probe board (PB) that plugs into the MB into one of the connectors. The purpose is to capture and analyze LB signals for a logic analyzer. The PB's function is to provide nicely grouped "probes" for use during debug and characterization of the prototype. It is basically an interface from probe points on an MB to standard Logic Analyzer connectors (like MICTOR) and is simply a convenience for the prototype developer.

Figure 8:
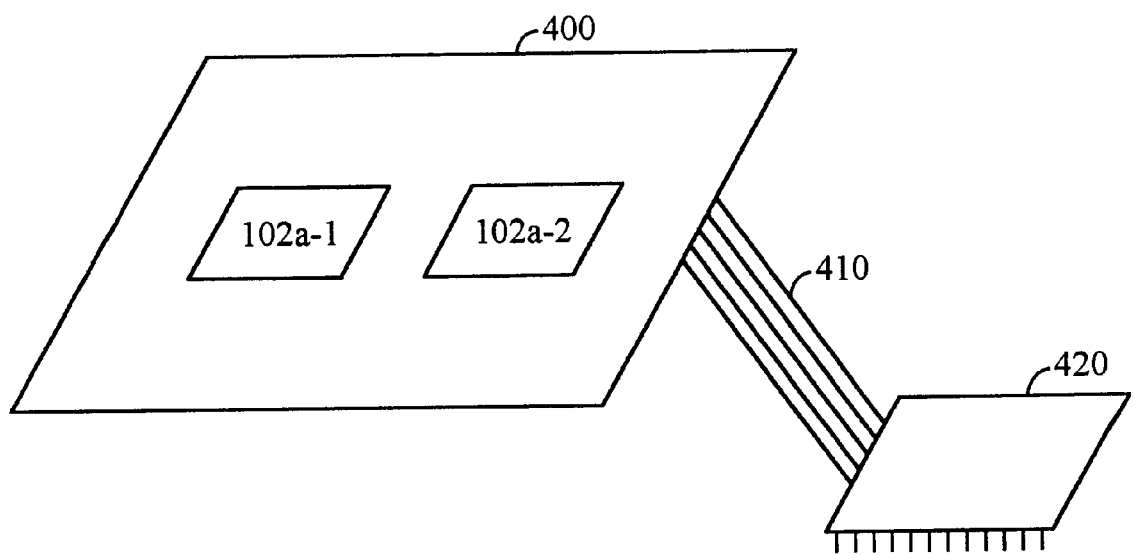
FIG. 8 depicts an expander mezzanine board according to an embodiment of the invention.

FIG. 8 depicts an expander mezzanine board (EMB) 400 according to an embodiment of the invention. The EMB has a ribbon cable 410 coupled to a plug 420 that fits into an IC site. The EMB is intended to allow additional functions to be performed such as more functions than can be performed on a signal IC, or additional memory functions that can be used by other ICs. The EMB's function is to provide the ability to link subsystems to the prototype that will not fit easily into an individual IC site. These can be existing boards from $3^{rd}$ party vendors like Digital Signal Processing (DSP) boards and Microprocessor development boards, or full-custom boards to implement specific functions required in a particular prototype.

Figure 9:
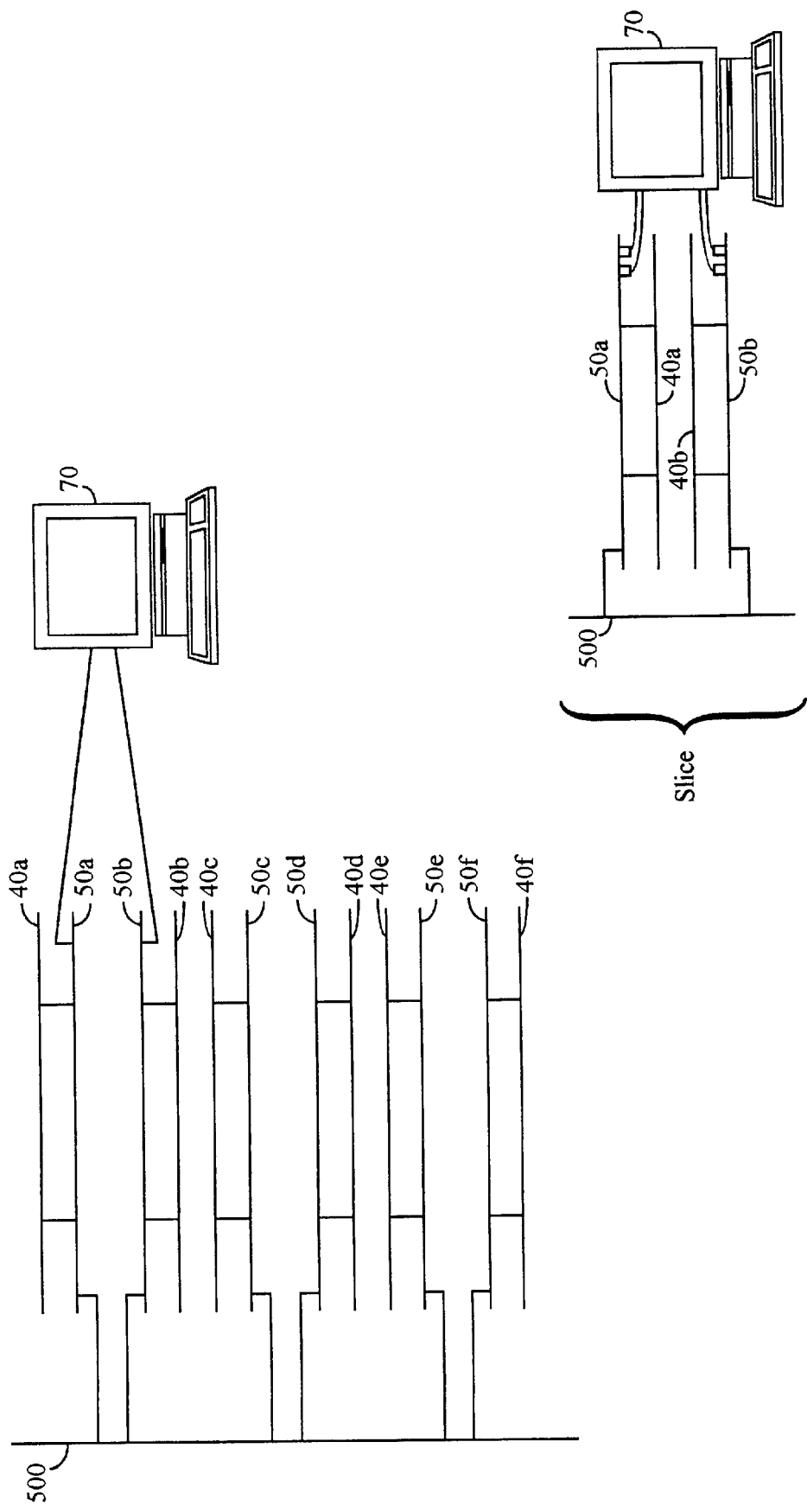
FIG. 9 depicts a scaled architecture according to an embodiment of the invention.

The invention includes some advanced architectures for prototyping target circuits. When the target circuit becomes very complex, the engineer may want more function than is supplied on a single LB. In this case depicted in FIG. 9, multiple LBs are used to scale the target circuit to generate any size prototype. A backplane printed circuit board 500 is constructed. The MBs 50a–50f each have a connector 502a–502f that permits interconnection to the backplane 500. The backplane 500 is one of the external structures that can be coupled to the MB, as described above. In this manner, the prototype can be scaled to prototype a target circuit of any size.

In conclusion, it will be apparent to those skilled in the art that the invention provides many advantages over known techniques. Advantages include providing a cost-effective technique for developing a prototype that combines the advantages of the custom prototype speed with the flexibility of the re-programmable emulators.

Having disclosed exemplary embodiments and the best mode, modifications and variations may be made to the disclosed embodiments while remaining within the scope of the invention as defined by the following claims.

What is claimed is:

1. A prototype development apparatus comprising:
   a logic board (LB) including a plurality of integrated circuit (IC) sites each adapted to receive an IC, logic traces coupled to each of said IC sites, and a plurality of logic board connector sites (LBCSs) each adapted to receive a connector and coupled to a number of said logic traces; and
   a mezzanine board (MB) including a plurality of mezzanine board connector sites (MBCSs) each adapted to receive a connector and coupled to a number of mezzanine traces interconnecting said MBCSs;
   said LBCSs each including a plurality of pads each coupled to a logic trace;
   said LBCSs each including a pair of holes in said LB adjacent to said pads;
   said MBCSs each including a plurality of pads each coupled to a mezzanine trace;
   said MBCSs each including a pair of holes in said LB adjacent to said pads;
   wherein each of said connectors includes:
      a flexible printed circuit board having a plurality of traces with raised dots on a first side adapted to connect to a plurality of pads and raised dots on a second side adapted to connect to a plurality of pads;
      a first pair of threaded receptors configured to receive a pair of threaded bolts disposed through said pair of holes in said LB, and configured such that when said threaded bolts are tightened, to press said dots on said first side to said plurality of pads in said LBCS; and
      a second pair of threaded receptors configured to receive a pair of threaded bolts disposed through said pair of holes in said MB, and configured such that when said threaded bolts are tightened, to press dots on said second side to said plurality of pads in said MBCS.

2. A prototype development apparatus comprising:
   a logic board (LB) including a plurality of integrated circuit (IC) sites each adapted to receive an IC, logic traces coupled to each of said IC sites, and a plurality of logic board connector sites (LBCSs) each adapted to receive a connector and coupled to a number of said logic traces; and
   a mezzanine board (MB) including a plurality of mezzanine board connector sites (MBCSs) each adapted to receive a connector and coupled to a number of mezzanine traces interconnecting said MBCSs;
   said LBCSs each including a plurality of pads disposed in a substantially rectangular pattern each coupled to a logic trace;
   said LBCSs each including a pair of holes in said LB adjacent to opposite sides of said rectangular pattern;
   said MBCSs each including a plurality of pads disposed in a substantially rectangular pattern each coupled to a mezzanine trace;
   said MBCSs each including a pair of holes in said LB adjacent to opposite sides of said rectangular pattern;
   wherein each of said connectors includes:
      a flexible printed circuit board having a plurality of traces with raised dots on a first side adapted to connect to a plurality of pads and raised dots on a second side adapted to connect to a plurality of pads;
      of threaded bolts disposed through said pair of holes in said LB, and configured such that when said threaded bolts are tightened, to press said dots on said first side to said plurality of pads in said LBCS; and
      a second pair of threaded receptors configured to receive a pair of threaded bolts disposed through said pair of holes in said MB, and configured such that when said threaded bolts are tightened, to press dots on said second side to said plurality of pads in said MBCS.

3. A prototype development apparatus comprising:
a logic board (LB) including a plurality of integrated circuit (IC) sites each adapted to receive an IC, logic traces coupled to each of said IC sites, and a plurality of logic board connector sites (LBCSs) each adapted to receive a connector and coupled to a number of said logic traces; and
a mezzanine board (MB) including a plurality of mezzanine board connector sites (MBCSs) each adapted to receive a connector and coupled to a number of mezzanine traces interconnecting said MBCSs;
said LBCSs each including a plurality of raised dots each coupled to a logic trace;
said LBCSs each including a pair of holes in said LB adjacent to said raised dots;
said MBCSs each including a plurality of raised dots each coupled to a mezzanine trace;
said MBCSs each including a pair of holes in said LB adjacent to said raised dots;
wherein each of said connectors includes:
 a flexible printed circuit board having a plurality of connector traces exposed on a first side and adapted to connect to a plurality of dotted pads, and exposed on a second side and adapted to connect to a plurality of dotted pads;
 a first pair of threaded receptors configured to receive a pair of threaded bolts disposed through said pair of holes in said LB, and configured such that when said threaded bolts are tightened, to press said connector traces exposed on said first side to said plurality of dotted pads in said LBCS; and
 a second pair of threaded receptors configured to receive a pair of threaded bolts disposed through said pair of holes in said MB, and configured such that when said threaded bolts are tightened, to press said connector traces exposed on said second side to said plurality of dotted pads in said MBCS.

4. A prototype development apparatus comprising:
a logic board (LB) including a plurality of integrated circuit (IC) sites each adapted to receive an IC, logic traces coupled to each of said IC sites, and a plurality of logic board connector sites (LBCSs) each adapted to receive a connector and coupled to a number of said logic traces; and
a mezzanine board (MB) including a plurality of mezzanine board connector sites (MBCSs) each adapted to receive a connector and coupled to a number of mezzanine traces interconnecting said MBCSs;
said LBCSs each including a plurality of raised dots disposed in a substantially rectangular pattern each coupled to a logic trace;
said LBCSs each including a pair of holes in said LB adjacent to opposite sides of said rectangular pattern;
said MBCSs each including a plurality of raised dots disposed in a substantially rectangular pattern each coupled to a mezzanine trace;
said MBCSs each including a pair of holes in said LB adjacent to opposite sides of said rectangular pattern;
wherein each of said connectors includes:
 a flexible printed circuit board having a plurality of connector traces exposed on a first side and adapted to connect to a plurality of dotted pads, and exposed on a second side and adapted to connect to a plurality of dotted pads;
 a first pair, of threaded receptors configured to receive a pair of threaded bolts disposed through said pair of holes in said LB, and configured such that when said threaded bolts are tightened, to press said connector traces exposed on said first side to said plurality of dotted pads in said LBCS; and
 a second pair of threaded receptors configured to receive a pair of threaded bolts disposed through said pair of holes in said MB, and configured such that when said threaded bolts are tightened, to press said connector traces exposed on said second side to said plurality of dotted pads in said MBCS.

5. The prototype development apparatus of claim 1, wherein:
each of said connectors further includes a resilient backing disposed behind said flexible printed circuit board to press said dots on said first side to said plurality of pads in said LBCS and to press said dots on said second side to said plurality of dotted pads in said MBCS.

6. The prototype development apparatus of claim 3, wherein:
each of said connectors further includes a resilient backing disposed behind said flexible printed circuit board to press said connector traces exposed on said first side to said plurality of dotted pads in said LBCS and to press said connector traces exposed on said second side to said plurality of dotted pads in said MBCS.

7. The prototype development apparatus of claim 1, wherein:
each of said connectors has a connect density greater than about 100 dots/inch$^2$.

8. The prototype development apparatus of claim 3, wherein:
each of said connectors has a connect density greater than about 100 dots/inch$^2$.

9. A prototype development apparatus comprising:
a logic board (LB) including a plurality of integrated circuit (IC) sites each adapted to receive an IC, logic traces coupled to each of said IC sites, and a plurality of logic board connector sites (LBCSs) each adapted to receive a connector and coupled to a number of said logic traces; and
a mezzanine board (MB) including a plurality of mezzanine board connector sites (MBCSs) each adapted to receive a connector and coupled to a number of mezzanine traces interconnecting said MBCSs;
said logic traces being divided into a group of power traces, a group of clock traces and a group of signal traces;
said LBCSs being coupled to a number of signal traces;
said LB including a logic board clock connector site LBCCS coupled to a number of said clock traces and adapted to receive a clock connector;
said prototype development apparatus further comprising a clock mezzanine board (CMB) having a clock mezzanine board connector site (CMBCS) adapted to receive said clock connector and coupled to a number of mezzanine clock traces.

10. The prototype development apparatus of claim 9, wherein:
said LB includes a programmable delay buffer coupled to said clock traces and configured to selectively delay signals on said clock traces.

11. A prototype development apparatus comprising:
a logic board (LB) including a plurality of integrated circuit (IC) sites each adapted to receive an IC, logic traces coupled to each of said IC sites, and a plurality of logic board connector sites (LBCSs) each adapted to receive a connector and coupled to a number of said logic traces; and
a mezzanine board (MB) including a plurality of mezzanine board connector sites (MBCSs) each adapted to receive a connector and coupled to a number of mezzanine traces interconnecting said MBCSs;
said LB including a logic board incremental connector site LBICS coupled to a number of said logic traces and adapted to receive an incremental connector;
said prototype development apparatus further comprising an incremental mezzanine board (IMB) having an incremental mezzanine board connector site (IBMCS) adapted to receive said incremental connector and coupled to a number of incremental mezzanine traces.

12. A prototype development apparatus comprising:
a logic board (LB) including a plurality of integrated circuit (IC) sites each adapted to receive an IC, logic traces coupled to each of said IC sites, and a plurality of logic board connector sites (LBCSs) each adapted to receive a connector and coupled to a number of said logic traces; and
a mezzanine board (MB) including a plurality of mezzanine board connector sites (MBCSs) each adapted to receive a connector and coupled to a number of mezzanine traces interconnecting said MBCSs;
said ICs including programmable grid arrays (PGAs);
said LB including a logic board clock connector site LBCCS coupled to a number of said clock traces and adapted to receive a clock connector;
said prototype development apparatus further comprising a clock mezzanine board (CMB) having a clock mezzanine board connector site (CMBCS) adapted to receive said clock connector and coupled to a number of mezzanine clock traces;
said prototype development apparatus further comprising a buffer board disposed between said LB and said MB and having a plurality of buffer board connector sites (BBCSS) coupled to a number of buffer traces and adapted to receive a connector;
one of said BBCSs being coupled to said LB and another of said BBCSs being coupled to said MB.

13. A method of constructing a prototype apparatus comprising the steps of:
fabricating a logic board (LB) including a plurality of integrated circuit (IC)sites each adapted to receive an IC, logic traces coupled to each of said IC sites, and a plurality of logic board connector sites (LBCSs) each adapted to receive a connector and coupled to a number of said logic traces;
fabricating a mezzanine board (MB) having a plurality of mezzanine board connector sites (MBCSs) each adapted to receive a connector and coupled to a number of mezzanine traces interconnecting said MBCSs;
coupling said LB and said MB via a plurality of connectors connected to said LBCSs and said MBCSs;
fabricating a second mezzanine board (2 MB) having a plurality of second mezzanine board connector sites (2 MBCSs) each adapted to receive a connector and coupled to a number of mezzanine traces interconnecting said 2 MBCSs and having a different connectivity between said 2 MBCSs than said MBCSs;
decoupling said MB from said LB; and
coupling said LB and said 2 MB via a plurality of connectors connected to said LBCSs and said 2 MBCSs.

14. A method of constructing a prototype apparatus comprising the steps of:
fabricating a logic board (LB) including a plurality of integrated circuit (IC)sites each adapted to receive an IC, logic traces coupled to each of said IC sites, and a plurality of logic board connector sites (LBCSs) each adapted to receive a connector and coupled to a number of said logic traces;
fabricating a mezzanine board (MB) having a plurality of mezzanine board connector sites (MBCSs) each adapted to receive a connector and coupled to a number of mezzanine traces interconnecting said MBCSs; and
coupling said LB and said MB via a plurality of connectors connected to said LBCSs and said MBCSS;
fabricating a plurality of identical logic boards (LBs) each including a plurality of integrated circuit (IC) sites each adapted to receive an IC, logic traces coupled to each of said IC sites, and a plurality of logic board connector sites (LBCSs) coupled to a number of said logic traces and each adapted to receive a connector;
fabricating a plurality of different mezzanine boards (MBs) having a plurality of mezzanine board connector sites (MBCSs) each adapted to receive a connector and coupled to a number of differently routed mezzanine traces interconnecting said MBCSs; and
coupling each of said LBs and said MBs via a plurality of connectors connected to said LBCSs and said MBCSs.

15. A method of constructing a prototype apparatus comprising the steps of:
fabricating a logic board (LB) including a plurality of integrated circuit (IC)sites each adapted to receive an IC, logic traces coupled to each of said IC sites, and a plurality of logic board connector sites (LBCSs) each adapted to receive a connector and coupled to a number of said logic traces;
fabricating a mezzanine board (MB) having a plurality of mezzanine board connector sites (MBCSs) each adapted to receive a connector and coupled to a number of mezzanine traces interconnecting said MBCSs; and
coupling said LB and said MB via a plurality of connectors connected to said LBCSs and said MBCSs;
fabricating a plurality of identical logic boards (LBs) each including a plurality of integrated circuit (IC) sites each adapted to receive an IC, logic traces coupled to each of said IC sites, and a plurality of logic board connector sites (LBCSs) coupled to a number of said logic traces and each adapted to receive a connector;
fabricating a plurality of different mezzanine boards (MBs) having a plurality of mezzanine board connector sites (MBCSs) each adapted to receive a connector and coupled to a number of differently routed mezzanine traces interconnecting said: MBCSs, said differently routed mezzanine traces being routed based on requirements of a target circuit; and
coupling each of said LBs and said MBs via a plurality of connectors connected to said LBCSs and said MBCSs.

16. A method of constructing a prototype apparatus comprising the steps of:
fabricating a logic board (LB) including a plurality of integrated circuit (IC)sites each adapted to receive an IC, logic traces coupled to each of said IC sites, and a plurality of logic board connector sites (LBCSs) each adapted to receive a connector and coupled to a number of said logic traces;

fabricating a mezzanine board (MB) having a plurality of mezzanine board connector sites (MBCSs) each adapted to receive a connector and coupled to a number of mezzanine traces interconnecting said MBCSs; and coupling said LB and said MB via a plurality of connectors connected to said LBCSs and said MBCSs;

fabricating a plurality of identical logic boards (LBs) each including a plurality of integrated circuit (IC) sites each adapted to receive an IC, logic traces coupled to each of said IC sites, and a plurality of logic board connector sites (LBCSs) coupled to a number of said logic traces and each adapted to receive a connector;

partially fabricating a plurality of identical mezzanine boards (MBs) having a plurality of mezzanine board connector sites (MBCSs) each adapted to receive a connector and coupled to a number of identically routed mezzanine traces interconnecting said MBCSs; and completing fabricating of said plurality of said identical MBs by routing differently routed mezzanine traces on each of said MBs, said differently routed mezzanine traces being routed based on requirements of a target circuit.

17. A method of prototyping a target circuit using a logic board (LB) having a plurality of programmable integrated circuits (PICs) and a number of logic traces, and a mezzanine board (MB), comprising the steps of:

generating a net list representative of said target circuit;

dividing said net list into first portions to be programmed into said PICs and second portions to interconnect said PICs;

programming said first portions into said PICs;

fabricating said MB including mezzanine traces based on said second portions; and coupling said logic traces and said mezzanine traces such that said target circuit is configured from both said LB and said MB;

wherein said LB has a clock mezzanine board (CMB) coupled to provide a clock to said PICs, and wherein said method further comprises the steps of:

supplying a clock to said PICs on said LB.

18. A method of prototyping a target circuit using a logic board (LB) having a plurality of programmable integrated circuits (PICs) and a number of logic traces, and a mezzanine board (MB), comprising the steps of:

generating a net list representative of said target circuit;

dividing said net list into first portions to be programmed into said PICs and second portions to interconnect said PICs;

programming said first portions into said PICs;

fabricating said MB including mezzanine traces based on said second portions; and coupling said logic traces and said mezzanine traces such that said target circuit is configured from both said LB and said MB;

wherein:

a plurality of said mezzanine traces are spare traces; and when an error is discovered and corrected to create a new target circuit, said method further comprises the steps of:

regenerating a new netlist representative of said new target circuit;

dividing said new netlist into new first portions to be programmed into said PICs and new second portions to interconnect said PICs, said dividing step using said spare traces to form a part of said second portion;

programming said new first portions into said PICs; and coupling said logic traces and said mezzanine traces such that said target circuit is configured from both said LB and said MB.

* * * * *